US012610820B2

(12) United States Patent
Wells et al.

(10) Patent No.: US 12,610,820 B2
(45) Date of Patent: Apr. 21, 2026

(54) POWER MODULE THERMAL MANAGEMENT SYSTEM

(71) Applicant: PC KRAUSE AND ASSOCIATES, INC., West Lafayette, IN (US)

(72) Inventors: Jason Wells, West Lafayette, IN (US); Nicholas Benavides, West Lafayette, IN (US); Justin Weibel, West Lafayette, IN (US); Kevin Mccarthy, West Lafayette, IN (US)

(73) Assignee: PC KRAUSE AND ASSOCIATES, INC., West Lafayette, IN (US)

( * ) Notice: Subject to any disclaimer, the term of this patent is extended or adjusted under 35 U.S.C. 154(b) by 366 days.

(21) Appl. No.: 18/370,068

(22) Filed: Sep. 19, 2023

(65) Prior Publication Data

US 2024/0096749 A1 Mar. 21, 2024

Related U.S. Application Data

(60) Provisional application No. 63/407,822, filed on Sep. 19, 2022.

(51) Int. Cl.
H01L 23/473 (2006.01)

(52) U.S. Cl.
CPC ................................. H01L 23/4735 (2013.01)

(58) Field of Classification Search
CPC ............... H01L 23/4735; H01L 23/295; H01L 23/3737; H10D 62/121; H10D 30/6735
See application file for complete search history.

(56) References Cited

U.S. PATENT DOCUMENTS

| | | | | |
|---|---|---|---|---|
| 5,168,348 A | * | 12/1992 | Chu | ..................... H01L 23/4338 |
| | | | | 257/713 |
| 5,565,705 A | | 10/1996 | Romero | |
| 7,331,377 B1 | * | 2/2008 | Toy | ..................... H01L 23/3732 |
| | | | | 257/714 |
| 10,306,802 B1 | * | 5/2019 | Ditri | ................... H01L 23/4735 |
| 10,798,851 B1 | * | 10/2020 | Weber | ................ H05K 7/20327 |
| 2005/0276014 A1 | | 12/2005 | Prasher | |
| 2006/0026970 A1 | | 2/2006 | Tilton | |

(Continued)

FOREIGN PATENT DOCUMENTS

GB 2526171 11/2015

OTHER PUBLICATIONS

US Office Action for U.S. Appl. No. 18/368,902 mailed Mar. 5, 2026, 16 pages.

*Primary Examiner* — Evren Seven
(74) *Attorney, Agent, or Firm* — Barnes & Thornburg LLP

(57) ABSTRACT

A thermal management system includes a baseplate assembly and a flow system. The baseplate assembly includes a baseplate and a semiconductor die. The flow system includes a submerged jet impingement assembly for direct semiconductor die cooling, a first flow path extending over the semiconductor die via the submerged jet impingement assembly, and a second flow path in thermal contact with the baseplate, the flow system including a fluid flowing through the first flow path and the second flow path. The flow system is configured to direct the fluid to the upper semiconductor surface of the semiconductor die via the first flow path and to the baseplate via the second flow path so as to transfer heat away from the semiconductor die and from the baseplate so as to cool the baseplate assembly.

20 Claims, 11 Drawing Sheets

(56)        References Cited

U.S. PATENT DOCUMENTS

2011/0304987 A1 *  12/2011  Oprins ................ H01L 23/4735
                                            361/699
2012/0212907 A1 *   8/2012  Dede ................... H01L 23/4735
                                            361/689
2014/0160677 A1 *   6/2014  de Bock ............ H01L 23/4735
                                            361/689
2017/0094837 A1     3/2017  Joshi
2019/0348345 A1    11/2019  Parida
2023/0114057 A1 *   4/2023  Rush ................. H05K 7/20936
                                            361/699

* cited by examiner

222

218

Viewing underside of the top plate

O-ring groove

268

266

292G

232

222B

250

POWER MODULE THERMAL MANAGEMENT SYSTEM

CROSS-REFERENCE TO RELATED APPLICATIONS

This non-provisional application claims the benefit and priority, under 35 U.S.C. § 119(e) and any other applicable laws and statutes, to U.S. Provisional Application Ser. No. 63/407,822 filed on Sep. 19, 2022, the entire disclosure of which is incorporated herein by reference.

BACKGROUND

The present disclosure relates to electronic systems, in particular electronic systems having more power dense solutions and improving the operation of such systems.

SUMMARY

According to the present disclosure, a thermal management system includes a baseplate assembly and a flow system. The baseplate assembly includes a baseplate defining an upper baseplate surface and a semiconductor die defining an upper semiconductor surface, the semiconductor die being arranged on the baseplate such that the upper semiconductor surface is spaced apart from the upper baseplate surface. The flow system including a submerged jet impingement assembly for direct semiconductor die cooling, a first flow path extending over the semiconductor die via the submerged jet impingement assembly, and a second flow path in thermal contact with the baseplate, the flow system including a fluid flowing through the first flow path and the second flow path.

In some embodiments, the flow system is configured to direct the fluid to the upper semiconductor surface of the semiconductor die via the first flow path and to the baseplate via the second flow path so as to transfer heat away from the semiconductor die and from the baseplate so as to cool the baseplate assembly, In some embodiments, the submerged jet impingement assembly includes an inlet manifold that extends transversely above the upper semiconductor surface of the semiconductor die and at least one delivery nozzle fluidically connected to and extending downwardly away from the inlet manifold, and the fluid is directed through the inlet manifold, through the at least one delivery nozzle, and onto the upper semiconductor surface of the semiconductor die to cool the semiconductor die.

In some embodiments, the baseplate assembly further includes an enclosure arranged on the upper baseplate surface of the baseplate and housing the semiconductor die. In some embodiments, the enclosure defines a top surface including at least one opening, the inlet manifold is arranged above the top surface of the enclosure, and the at least one delivery nozzle extends through the at least one opening.

In some embodiments, the first flow path is defined by at least one surface inlet channel that directs the fluid to the inlet manifold and at least one surface outlet channel that receives the fluid from the enclosure after it has been directed to the upper semiconductor surface via the at least one delivery nozzle and directs the fluid away from the semiconductor die. In some embodiments, the second flow path is defined by at least one baseplate inlet channel that directs the fluid into thermal contact with the baseplate, at least one baseplate cooling channel that directs the fluid over or through the baseplate, and at least one baseplate outlet channel that receives the fluid from the at least one baseplates cooling channel and directs the fluid away from the baseplate.

In some embodiments, the flow system further includes a common surface outlet channel fluidically connected to the at least one surface outlet channel and to the at least one baseplate inlet channel such that the fluid is configured to flow from the at least one surface outlet channel to the at least one baseplate inlet channel so as to define a single continuous flow path from the first flow path to the second flow path.

In some embodiments, the fluid includes a first fluid and a second fluid, wherein the flow system further includes a surface inlet supply channel configured to supply the first fluid to the first flow path and a baseplate inlet supply channel configured to supply the second fluid to the second flow path, and the first flow path is not in fluidic communication with the second flow path.

In some embodiments, the first fluid is different than the second fluid. In some embodiments, the baseplate is a low thermal impedance baseplate and the fluid is a dielectric refrigerant. In some embodiments, the semiconductor die is a field effect transistor die and is directly exposed to the fluid. In some embodiments, the fluid is a hydrofluorocarbon refrigerant.

According to a further aspect of the present disclosure, a thermal management system includes a baseplate assembly including a baseplate and a semiconductor die, and a flow system including a submerged jet impingement assembly for direct semiconductor die cooling and a fluid configured to flow through the flow system. The flow system is configured to direct the fluid to the semiconductor die via the submerged jet impingement assembly and to the baseplate so as to transfer heat away from the semiconductor die and from the baseplate so as to cool the baseplate assembly.

In some embodiments, the baseplate is a low thermal impedance baseplate. In some embodiments, the fluid is a dielectric refrigerant.

In some embodiments, the flow system includes a single continuous flow path that extends over the semiconductor die via the submerged jet impingement assembly and that is in thermal contact with the low thermal impedance baseplate.

In some embodiments, the submerged jet impingement assembly includes an inlet manifold that extends transversely above an upper semiconductor surface of the semiconductor die and at least one delivery nozzle fluidically connected to and extending downwardly away from the inlet manifold, and the fluid is directed through the inlet manifold, through the at least one delivery nozzle, and onto the upper semiconductor surface of the semiconductor die to cool the semiconductor die.

In some embodiments, the baseplate assembly further includes an enclosure arranged on the upper baseplate surface of the baseplate and housing the semiconductor die. In some embodiments, the enclosure defines a top surface including at least one opening, wherein the inlet manifold is arranged above the top surface of the enclosure, and wherein the at least one delivery nozzle extends through the at least one opening.

According to a further aspect of the present disclosure, a method includes providing a baseplate assembly including a baseplate defining an upper baseplate surface and a semiconductor die defining an upper semiconductor surface, arranging the semiconductor die on the baseplate such that the upper semiconductor surface is spaced apart from the upper baseplate surface, providing a flow system including a submerged jet impingement assembly for direct semiconductor die cooling, a first flow path extending over the semiconductor die via the submerged jet impingement assembly, and a second flow path in thermal contact with the baseplate, the flow system including a fluid flowing through the first flow path and the second flow path, and directing the fluid to the upper semiconductor surface of the semiconductor die via the first flow path and to the baseplate via the second flow path so as to transfer heat away from the semiconductor die and from the baseplate so as to cool the baseplate assembly.

Additional features of the present disclosure will become apparent to those skilled in the art upon consideration of illustrative embodiments exemplifying the best mode of carrying out the disclosure as presently perceived.

DETAILED DESCRIPTION

Figure 1A:
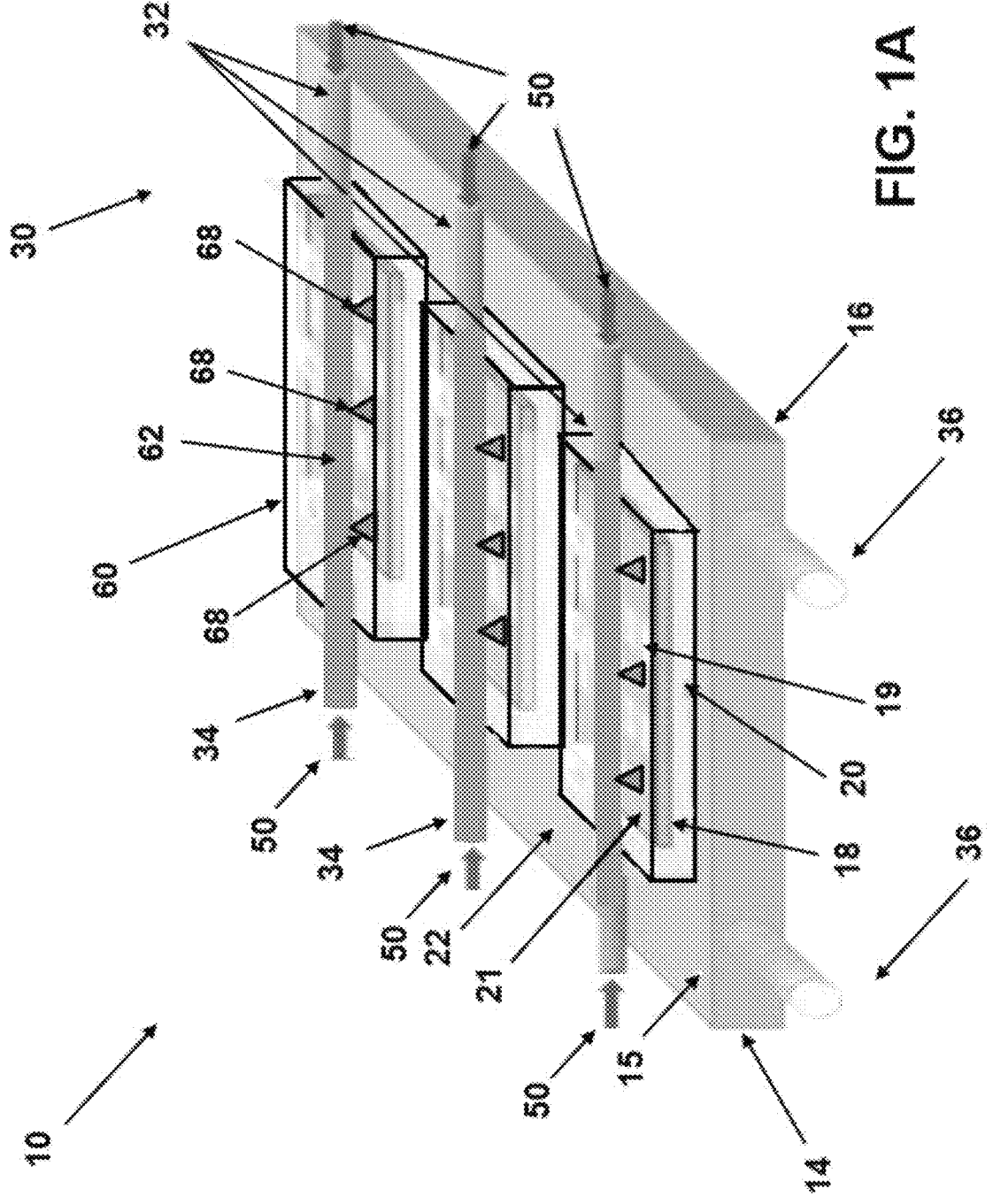
FIG. 1A is a perspective view of a thermal management system including a baseplate assembly, flow system, and submerged jet impingement assembly according to the present disclosure.

FIGS. 1-5 illustrate a thermal management system 10 according to a first aspect of the present disclosure. FIG. 6 illustrates a thermal management system 110 according to a further aspect of the present disclosure. FIGS. 7-9B illustrate a thermal management system 210 according to a further aspect of the present disclosure.

A thermal management system 10 includes a baseplate assembly 12 and a flow system 30. In an illustrated embodiment, the thermal management system 10 increases the heat transfer out of a semiconductor die 18 arranged on a baseplate 14 of the baseplate assembly 12 (the semiconductor die 18 may include semiconductor switches 19 arranged in power electronic modules 20 on the semiconductor die 18) via the flow system 30. The flow system 30 includes a submerged jet impingement assembly 60 configured to utilize jets 68 of fluid 50 to cool the semiconductor die 18, which the thermal management system 10 combines with direct cooling of the baseplate 14 to achieve overall cooling of the baseplate assembly 12.

As can be seen in FIGS. 1-4, the thermal management system 10 includes the baseplate assembly 12 and the flow system 30, which includes the submerged jet impingement assembly 60. The flow system 30 directs fluid 50 to the submerged jet impingement assembly 60, which produces impinging submerged jets 68 of the fluid 50 directly onto the exposed components (switches 19 and/or power electronic modules 20) and surfaces on the upper surface 21 of the semiconductor die 18. The flow system 30 also directs the fluid 50 to the baseplate 14 to cool the baseplate 14.

Illustratively, the baseplate 14 may be a low thermal impedance baseplate 14. A low thermal impedance baseplate 14 is combined with submerged jet impingement cooling to increase overall device heat rejection. The baseplate 14 may be formed from any material and shape known to a person skilled in the art, such as, for example but not limited to, cooper, aluminum, or similar base material, and may include a coating such as silver, gold, nickel, chromium, or similar coating materials.

A low thermal impedance baseplate 14 has an absence of thermal interface material required to couple the power electronic baseplate 14 to a cooling fluid. Comparative systems for thermal management use a thermal interface material in order to couple the baseplate 14 to a cooling apparatus, resulting in increased thermal resistance between cooling fluid and the die junctions arranged on the baseplate 14 (i.e. semiconductor die 18). As will be described below, surface area enhancements can be directly machined into the baseplate 14, such as the baseplate cooling channels 36 described below and shown in FIG. 1B and the heat transfer enhancements shown in FIGS. 2A-2C. The thermal interface materials and associated thermal resistance of conventional systems are eliminated, resulting in improved heat transfer performance. The baseplate 14 is configured to interface directly with the fluid 50 in order to reject heat out of the power electronic system (i.e. the combination of the baseplate 14 and the semiconductor die 18).

Figure 4:
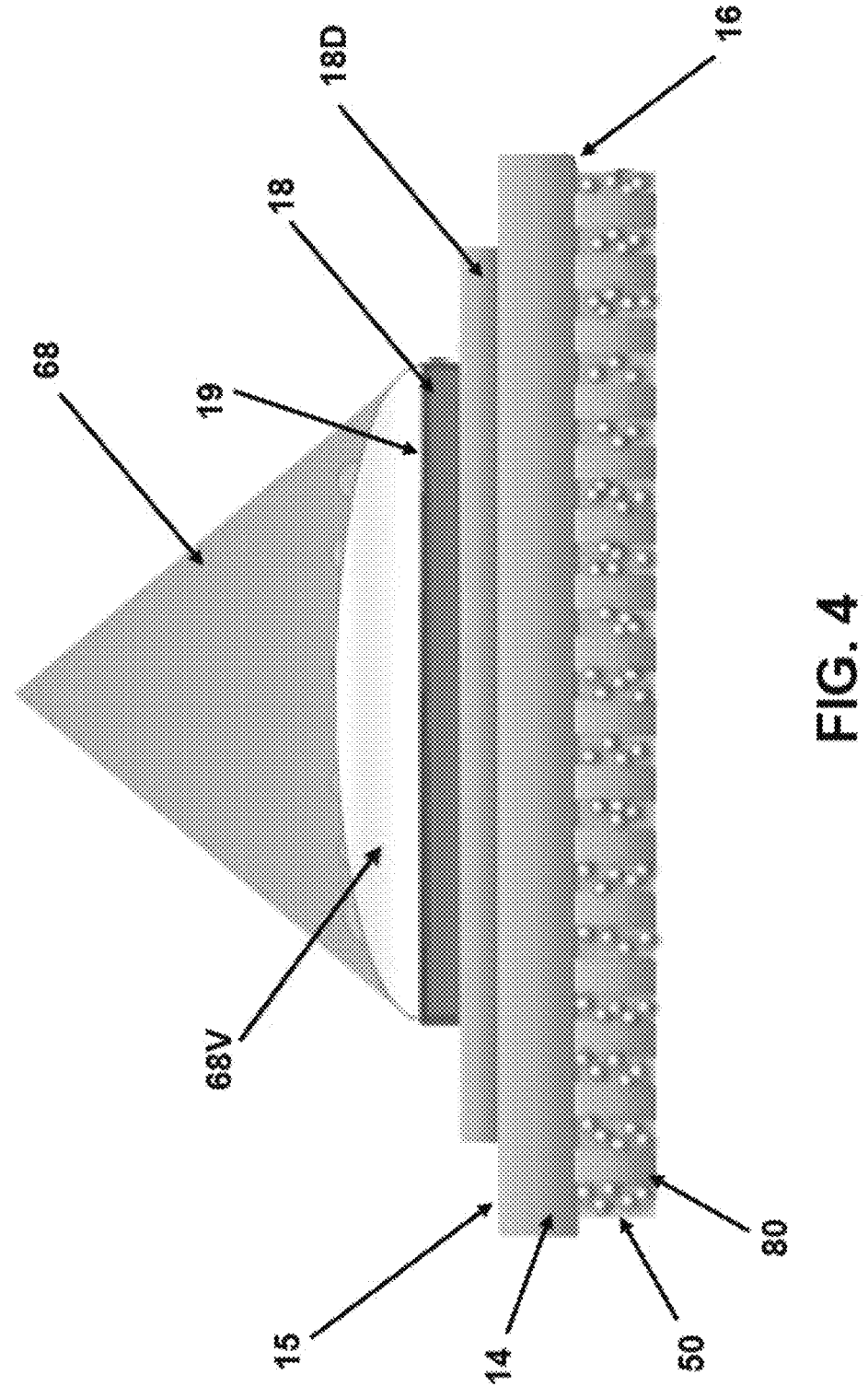
FIG. 4 is a cross-sectional view of a baseplate and semiconductor die of the baseplate assembly and a submerged jet of the submerged jet impingement assembly of FIGS. 1A-3.

As shown in FIG. 1A, the baseplate 14 defines an upper surface 15 on which the semiconductor die 18 is arranged. Illustratively, a direct bonded copper (DBC) layer 18D is formed on top of the upper surface 15 and the semiconductor dies 18 are arranged on the DBC layer 18D, as shown in FIG. 4. The DBC layer 18D is a structure that serves to provide an electrically conductive pathway, voltage isolation, and a thermal conductive pathway to the baseplate 14, which provides the heat transfer pathway out of the device. In some embodiments, the DBC layer 18D and the baseplate 14 itself can be collectively referred to as a "baseplate", although a person skilled in the art will understand that multiple layers, such as the baseplate 14 and DBC layer 18D of FIG. 4, may be included in such a "baseplate".

In one illustrated embodiment, one baseplate 14 may include multiple semiconductor dies 18 arranged thereon, as shown in FIG. 1A. Although three dies 18 are shown arranged in a column in FIG. 1A, any number of dies configured in any appropriate pattern may be arranged on the baseplate 14. The semiconductor die 18 defines an upper surface 21 including the switches 19 and/or power modules 20 described above. Due to the arrangement of the die 18 above the baseplate 14, the upper surface 21 of the semiconductor die 18 is spaced apart from the upper surface 15 of the baseplate 14. In some embodiments, the semiconductor die 18 may be a field effect transistor die ("FET"). In some embodiments, the entire semiconductor die 18 may be housed in a hermetically sealed enclosure 22.

Figure 3:
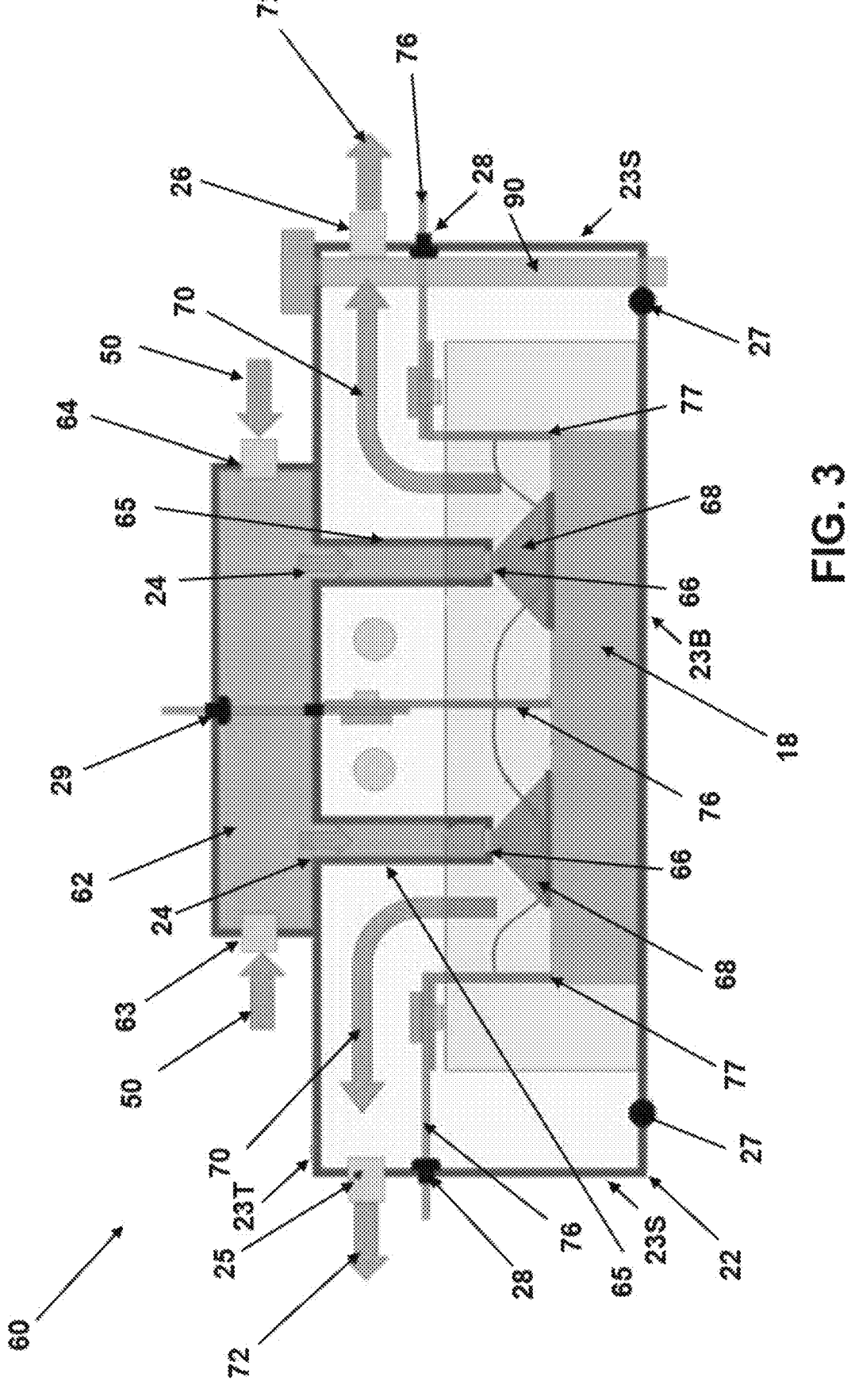
FIG. 3 is a cross-sectional view of the baseplate assembly, the submerged jet impingement assembly, and a portion of the flow system of FIGS. 1A and 1B.
Figure 5:
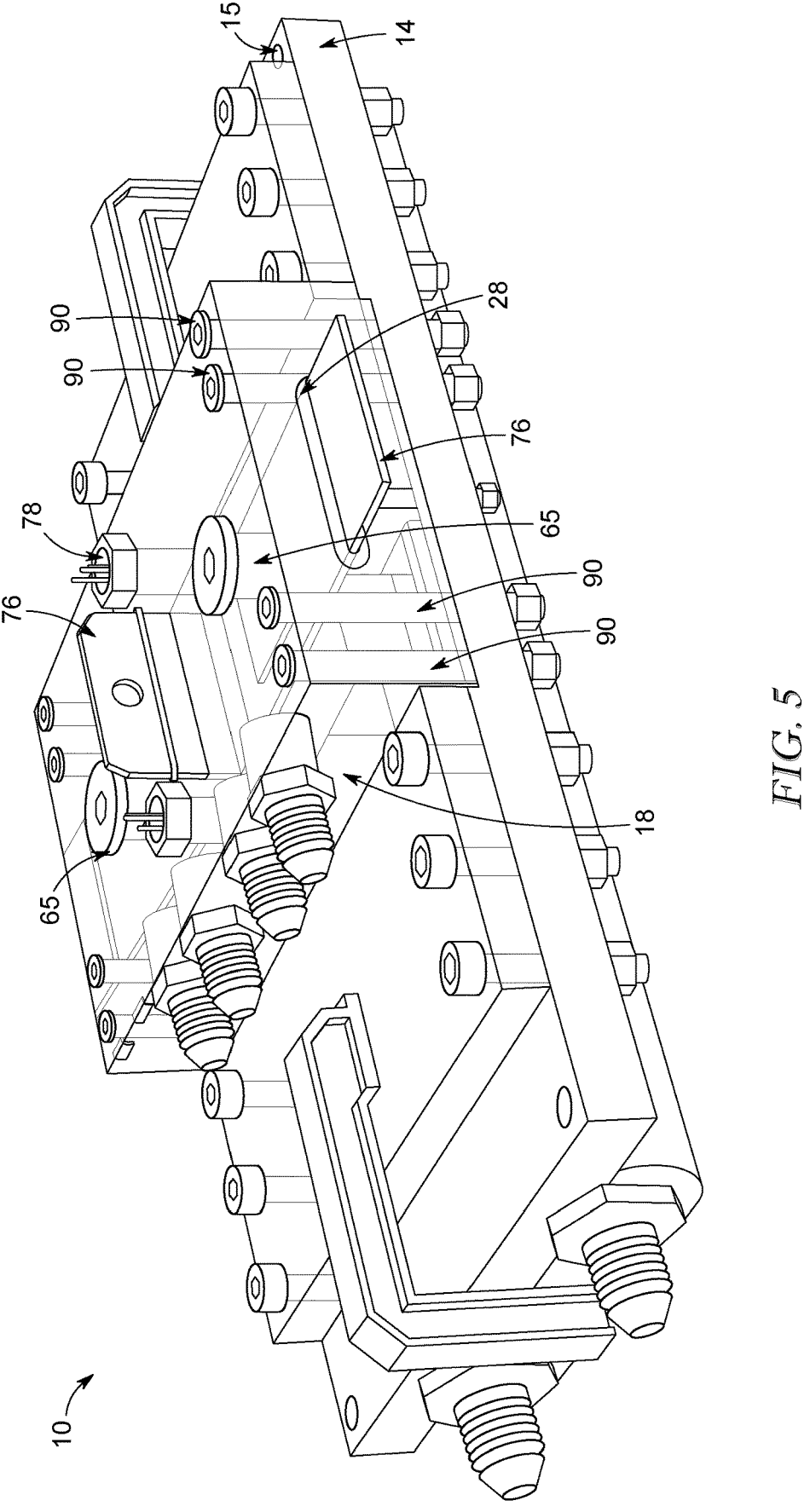
FIG. 5 is a perspective view of the thermal management system of FIGS. 1A-4.
Figure 6:
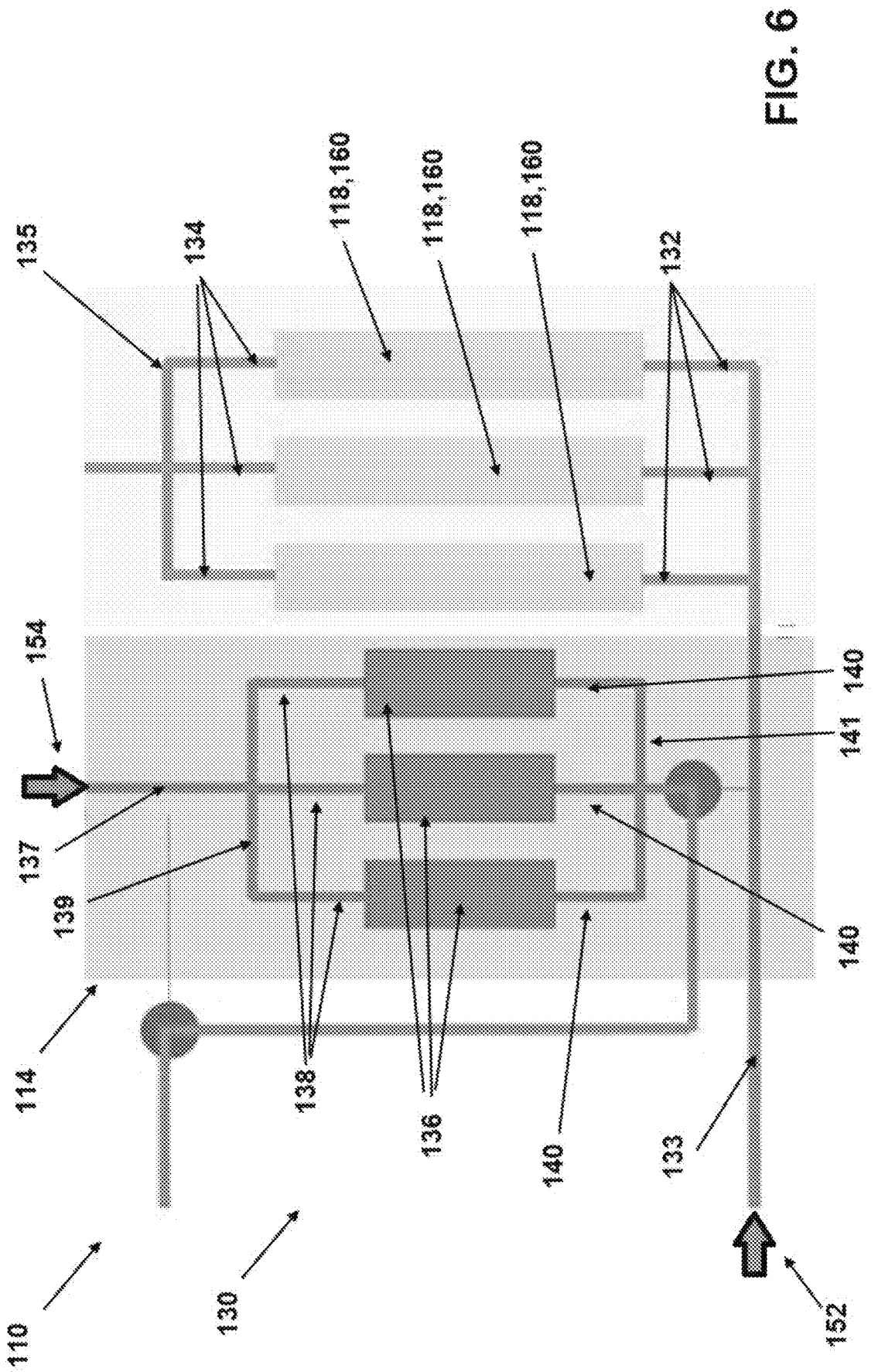
FIG. 6 is a schematic view of a thermal management system including a baseplate assembly and flow system according to an additional aspect of the present disclosure.

As shown in FIGS. 1A and 5, and in greater detail in FIG. 3, the enclosure 22 may be formed as a rectangular prims or cuboid and include a top surface 23T including at least one opening 24 formed therein. As will be described in detail below, a delivery nozzle 65 extends through the opening 24 and terminates just above the semiconductor die 18 and produces an impingement jet 68 therefrom. In some embodiments, the top surface 23T may include multiple openings 24 to accommodate multiple delivery nozzles 65, as shown in FIG. 3. For example, the top surface 23T may include two openings 24 to accommodate two delivery nozzles 65.

The enclosure 22 can further include various gaskets and O-rings to accommodate additional components housed within and extending away from the enclosure 22, as shown in FIG. 3. For example, one side 23S of the enclosure 22 can include an opening and corresponding O-ring seal 25 to allow the fluid 50 ejected away from the die 18 from the impingement jet 68 located near the O-ring seal 25 to exit the enclosure 22. Similarly, the opposing side 23S of the enclosure 22 can include an opening and corresponding O-ring seal 26 to allow the fluid 50 ejected away from the die 18 from the impingement jet 68 located near the O-ring seal 26 to exit the enclosure 22.

The opposing sides 23S of the enclosure 22 may also include openings with gaskets 28 for passing corresponding bus bars 76 and gate drive conductors 78 into the enclosure, as shown in FIGS. 3 and 5. The bus bars 76 may couple to the semiconductor die 18 at junction points 77. The bottom side 23B of the enclosure 22 may also include O-ring seals 27 that correspond with grooves (not shown) machined into the upper surface 15 of the baseplate 14 or the DBC layer 18B. The enclosure 22 may further include fastener bolts 90 that extend through the enclosure 22 and couple the enclosure 22 to the baseplate 14.

Illustratively, the flow system 30 directs the fluid 50 to the submerged jet impingement assembly 60 arranged above the semiconductor die 18 so as to cool the die 18, and subsequently to and through the low thermal impedance baseplate 14, as shown in FIGS. 1A-4. In some embodiments, the fluid 50 may be a dielectric refrigerant, although fluids with other properties may be utilized as would be known to a person skilled in the art. To avoid device failure and device contamination, the flow system 30 can use a dielectric fluid capable of providing appropriate standoff voltage to avoid device failures due to arcing and short circuits, while also being non-corrosive to avoid dissolving and degraded device structure and life. By way of a non-limiting example, the dielectric fluid 50 can be tetrafluoroethane, also referred to as R134a, available from Linde, Inc. Another non-limiting example of a dielectric fluid includes Honeywell Solstice® zd refrigerant, also referred to as R1233zd, available from Honeywell Belgium N.V.

Figure 1B:
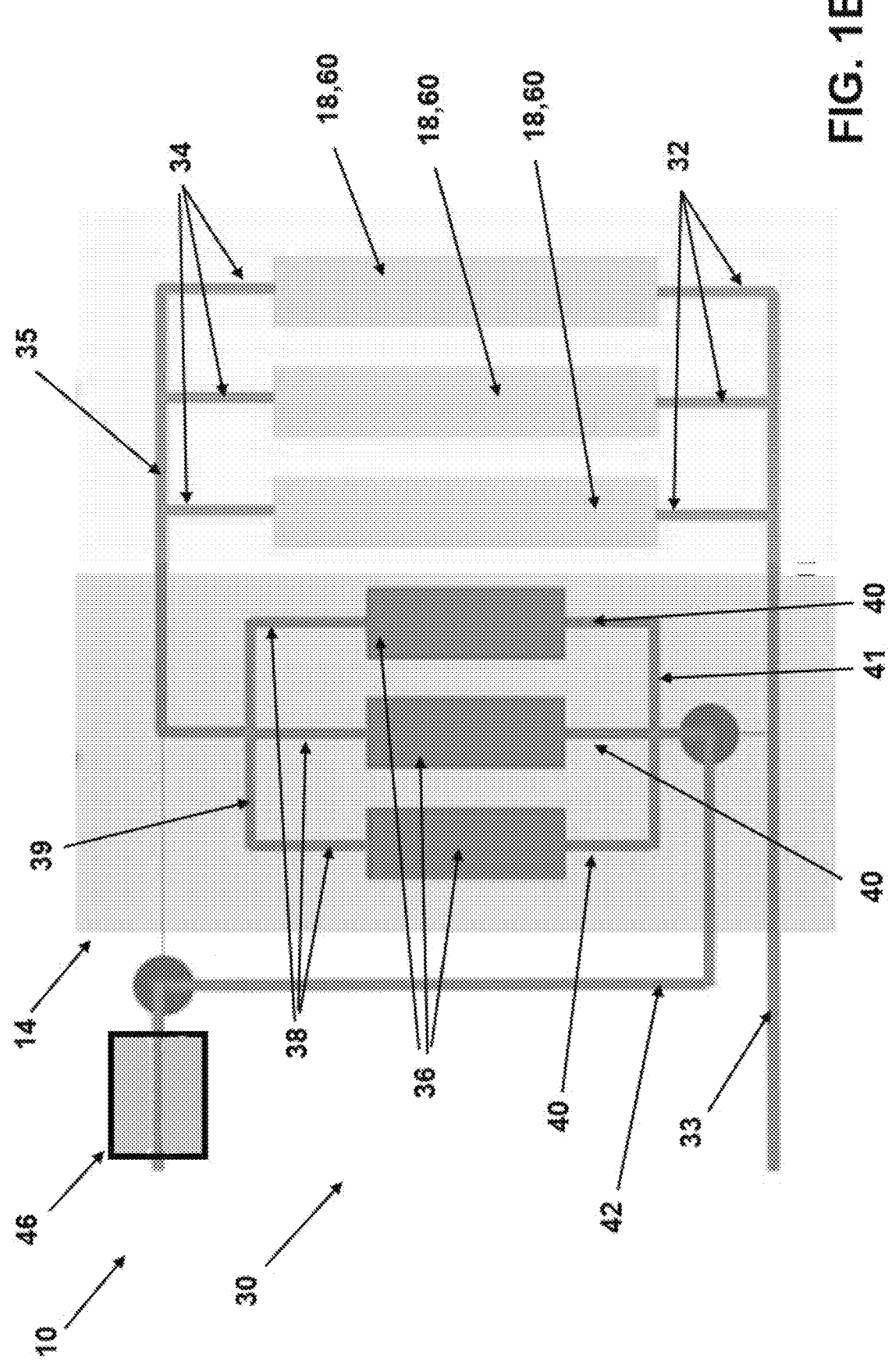
FIG. 1B is a schematic view of the thermal management system of FIG. 1A.

Illustratively, the flow system 30 may include a surface inlet channel 32 that directs fluid 50 to the submerged jet impingement assembly 60 arranged above the semiconductor die 18, and a surface outlet channel 34 that receives or removes the fluid from the submerged jet impingement assembly 60 and directs it to the baseplate 14, as shown schematically in FIG. 1B. The surface inlet and outlet channels 32, 34 may be tubes, pipes, or any similar fluid passageway structure known to a person skilled in the art. As will be described in greater detail below, the submerged jet impingement assembly 60 includes an inlet manifold 62 formed as a fluid channel, from which the delivery nozzles 65 extend, that connects to the surface inlet channel 32.

As shown in FIG. 1B, the surface outlet channel 34 of the flow system 30 extends from the enclosure 22 (i.e. from the submerged jet impingement assembly 60) to the baseplate 14 so as to pass the fluid 50 from the submerged jet impingement assembly 60 to the baseplate 14. In embodiments in which multiple dies 18 are utilized on the baseplate 14, each having its own the submerged jet impingement assembly 60, the surface outlet channel 34 extending away from each submerged jet impingement assembly 60 may extend to a common surface outlet channel 35, which then subsequently extends to the baseplate 14, as shown in FIG. 1B. Similarly, in such embodiments, a common surface supply channel 33 may be utilized which supplies the fluid 50 to the system 30 and to which each surface inlet channel 32 extends from. A pump or other known means may be utilized to pump the fluid 50 into the inlet channel 33 and subsequently to the surface inlet channels 32.

Figures 2A, 2B, 2C:
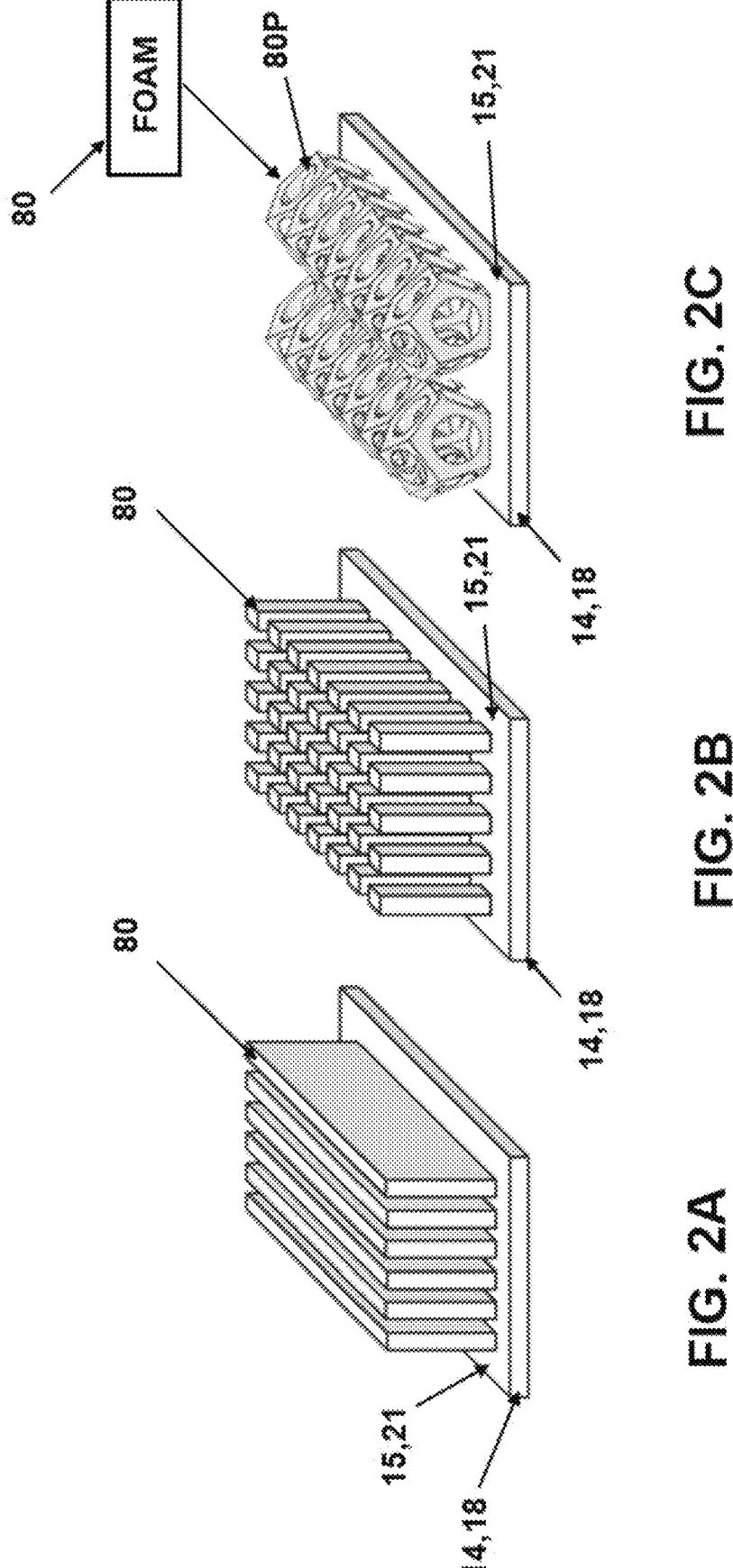
FIG. 2A is a perspective view of an exemplary heat transfer enhancement of a baseplate or semiconductor die of the baseplate assembly of FIG. 1A having elongated fins.
FIG. 2B is a perspective view of another exemplary heat transfer enhancement of a baseplate or semiconductor die of the baseplate assembly of FIG. 1A having narrow pins.
FIG. 2C is a perspective view of another exemplary heat transfer enhancement of a baseplate or semiconductor die of the baseplate assembly of FIG. 1A having porous foam.

The baseplate 14 may include a single baseplate cooling channel 36, or multiple cooling channels 36 as shown in FIG. 1B. The baseplate cooling channel 36 includes a baseplate inlet channel 38 and a baseplate outlet channel 40. In some embodiments, the baseplate cooling channel 36 can be machined directly into a bottom surface 16 of the baseplate 14, and can either be an open-top channel or can be closed and run through the body of the baseplate 14 (i.e. a microchannel), as shown in FIG. 1A. In some embodiments, a heat transfer enhancement 80 can be coupled to or formed on the baseplate 14 to improve heat transfer to the fluid 50, as shown in FIGS. 2A-2C.

The heat transfer enhancement 80 may include, but is not limited to, a microchannel, such as the baseplate cooling channel 36 formed in the interior of the baseplate 14, as shown in FIG. 1A. In some embodiments, the heat transfer enhancement 80 may include a pin fin array including either elongated fins, as shown in FIG. 2A, or narrow pins, as shown in FIG. 2B. In some embodiments, the heat transfer enhancement 80 may include porous foam including individual pores 80P that allow fluid 50 to pass therethrough, as shown in FIG. 2C.

In some embodiments, the upper surface 21 can include a heat transfer enhancement 80 attached to or formed on the upper surface 21 of the semiconductor die 18 similar to the heat transfer enhancements 80 on the baseplate 14. By way of non-limiting examples, the heat transfer enhancement 80 can be in the form of microchannels such as those extending through the baseplate 14 as described above, pin fin arrays as shown in FIGS. 2A and 2B, or foam structures as shown in FIG. 2C. Such surface enhancements 80 expand the thermal performance by increasing the surface area available for convection while also, in the case of a refrigerant cooling fluid, extending the nucleic boiling regime and further increasing the heat transfer potential. In other embodiments, the submerged jet 68 can be imparted on a flat, unaltered upper surface 21 of the semiconductor die 18.

In embodiments in which multiple baseplate cooling channels 36 are utilized, the common surface outlet channel 35 connects to a common baseplate inlet channel 39 that is connected to each baseplate inlet channel 38, and each baseplate outlet channel 40 connects to a common baseplate outlet channel 41, as shown in FIG. 1B. The common baseplate outlet channel 41 may connect to a system outlet channel 42 that directs the fluid 50 away from the baseplate 14. In some embodiments, the fluid 50 can be returned to the surface inlet channel 32 or common surface supply channel 33 from the system outlet channel 42 and recirculated through the flow system 30.

In some embodiments, the flow of the fluid 50 from the surface inlet channel 32, through the submerged jet impingement assembly 60, and to the surface outlet channel 34 may be referred to as a "first flow path" of the flow system 30. Similarly, the flow of the fluid 50 from the baseplate inlet channel 38, through the baseplate cooling channel 36, and to the baseplate outlet channel 40 may be referred to as a "second flow path" of the flow system 30. Together, the first and second flow paths being connected to each other via the flow of the fluid 50 from the surface inlet channel 32, over the semiconductor die 18, to the surface outlet channel 34, to the baseplate inlet channel 38, through the baseplate cooling channel 36, and to the baseplate outlet channel 40 may be referred to as a "single continuous flow path" of the flow system 30.

In addition to the heat transfer capabilities of the fluid 50 flowing through or over the baseplate 14, a heat transfer pathway is created by impinging submerged jets 68 directly onto the exposed surface 21 of the die 18, as shown in FIGS. 1A and 3. An inlet manifold 62 extends transversely across the semiconductor die 18, and includes openings with corresponding O-rings 63, 64 on opposing ends of the manifold 62 that couple to two surface inlet channels 32. The inlet manifold 62 may further include an opening and corresponding gasket 29 formed in a top surface of the inlet manifold 62 which allows an additional bus bar 76 to pass through the manifold 62 and through the gasket 29.

Illustratively, the assembly 60 includes two delivery nozzles 65 that are fluidically connected to and extend downwardly from the inlet manifold 62 so as to direct the fluid 50 from the manifold 62 to the delivery nozzles 65. The delivery nozzles 65 may be formed as tubes, pipes, or any other fluidic channel known to a person skilled in the art. Moreover, although two delivery nozzles 65 are shown, any number of channels 65 may be utilized based on the design requirements of the assembly 60.

Each delivery nozzle 65 includes an orifice 66 at a terminal end of the channel 65 opposite the inlet manifold 62, as shown in FIG. 3. The orifice 66 ejects a pressurized submerged impinging jet 68 on the upper surface 21 of the semiconductor die 18 in order to provide direct cooling of the die 18. The inlet manifold 62 and delivery nozzles 65 provide a path and targeted jet structure designed specifically for the die 18 surface area and jet spacing.

The submerged impinging jet 68 impacts the surface 21 of the die 18 resulting in large amounts of heat delivered to the fluid 50 quickly, reducing the junction temperatures as a result. In some operational scenarios, a vapor layer 68V may be formed between the jet 68 itself and the semiconductor die 18. The resultant fluid 50 is then discharged out of the enclosure 22 via the path 70 shown in FIG. 3. The fluid 50 exits through the O-ring 25, 26 openings formed on opposing sides 23S of the enclosure 22, in the directions 72 shown in FIG. 3. The surface outlet channels 34 are fluidically connected to the O-ring 25, 26 openings in order to receive the fluid 50 from the enclosure 22. After exiting the enclosure 22, the fluid 50 returns to a heat exchanger (i.e. heat exchanger 46 after passing through the baseplate 14, as shown in FIG. 1B) responsible for removing heat added to the fluid 50 from both the baseplate 14 and the submerged jet impingement assembly 60.

In operation, a continuous supply of fluid 50 is fed to the submerged jet impingement assembly 60 in order to remove heat from the semiconductor die 18. The fluid 50 can be provided to the flow system 30 in any manner that would be understood by a person skilled in the art. By way of non-limiting examples, the fluid 50 can be provided to the common surface supply channel 33 or the surface inlet channel 32 via active pumping, passive movement enabled by a change in density occurring in the heat transfer process, or passive heat transfer mechanisms such as heat pipes, oscillating heat pipes, vapor chambers, and thermosyphons. The fluid 50 is then directed to the baseplate cooling channels 36 in order to cool the baseplate 14. The fluid 50 may then exit the system 10 or be recirculated for additional cooling, either before or after passing through the heat exchanger 46.

Another embodiment of a flow system 130 of a thermal management system 110 in accordance with the present disclosure is shown in FIG. 6. The flow system 130 and thermal management system 110 are substantially similar to the flow system 30 and thermal management system 10 shown in FIGS. 1-5 and described above. Accordingly, similar reference numbers in the 100 series indicate features that are common between the thermal management system 110 and the thermal management system 10. The description of the thermal management system 10, and in particular the flow system 30, are incorporated by reference to apply to the thermal management system 110 and the flow system 130, except in instances when they conflict with the specific description and the drawings of the thermal management system 110 and the flow system 130.

Similar to the flow system 30 described above, the flow system 130 directs fluid to the semiconductor die 118 and submerged jet impingement assembly 160, and to the baseplate 114. Unlike the flow system 30, the flow system 130 utilizes a first fluid 152 and a second fluid 154. The first fluid 152 is directed to the submerged jet impingement assembly 160 for direct cooling. The second fluid 154 is separate from the first fluid 152 and is directed through the low thermal impedance baseplate 114. This is accomplished by the surface outlet channels 134 not being fluidically connected to the baseplate inlet channels 138. Instead, a separate supply of fluid, in particular a supply of the second fluid 154, is fluidically connected to the baseplate inlet channels 138 via a second supply channel 137. The first fluid 152 is provided to the surface inlet channels 132 via the common surface supply channel 133.

The fluids 152, 154 can include the same types of fluid described above with reference to the fluid 50, in particular those including the same dielectric and cooling properties. In some embodiments, the second fluid 154 is different from the first fluid 152. In other embodiments, the first and second fluid 152, 154 are the same type of fluid.

In some embodiments, the flow of the fluid 152 from the surface inlet channel 132, to the submerged jet impingement assembly 160, and to the surface outlet channel 134 may be referred to as a "first flow path" of the flow system 130. Similarly, the flow of the second fluid 154 from the baseplate inlet channel 138, through the baseplate cooling channel 136, and to the baseplate outlet channel 140 may be referred to as a "second flow path" of the flow system 130. In this embodiment, the first flow path is not in fluidic communication with the second flow path.

Another embodiment of a thermal management system 210 in accordance with the present disclosure is shown in FIGS. 7-9B. The thermal management system 210 is substantially similar to the thermal management systems 10, 110 shown in FIGS. 1-6 and described above. Accordingly, similar reference numbers in the 200 series indicate features that are common between the thermal management systems 10, 110 and the thermal management system 210. The description of the thermal management systems 10, 110 are incorporated by reference to apply to the thermal management system 210, except in instances when they conflict with the specific description and the drawings of the thermal management system 210.

Figure 7:
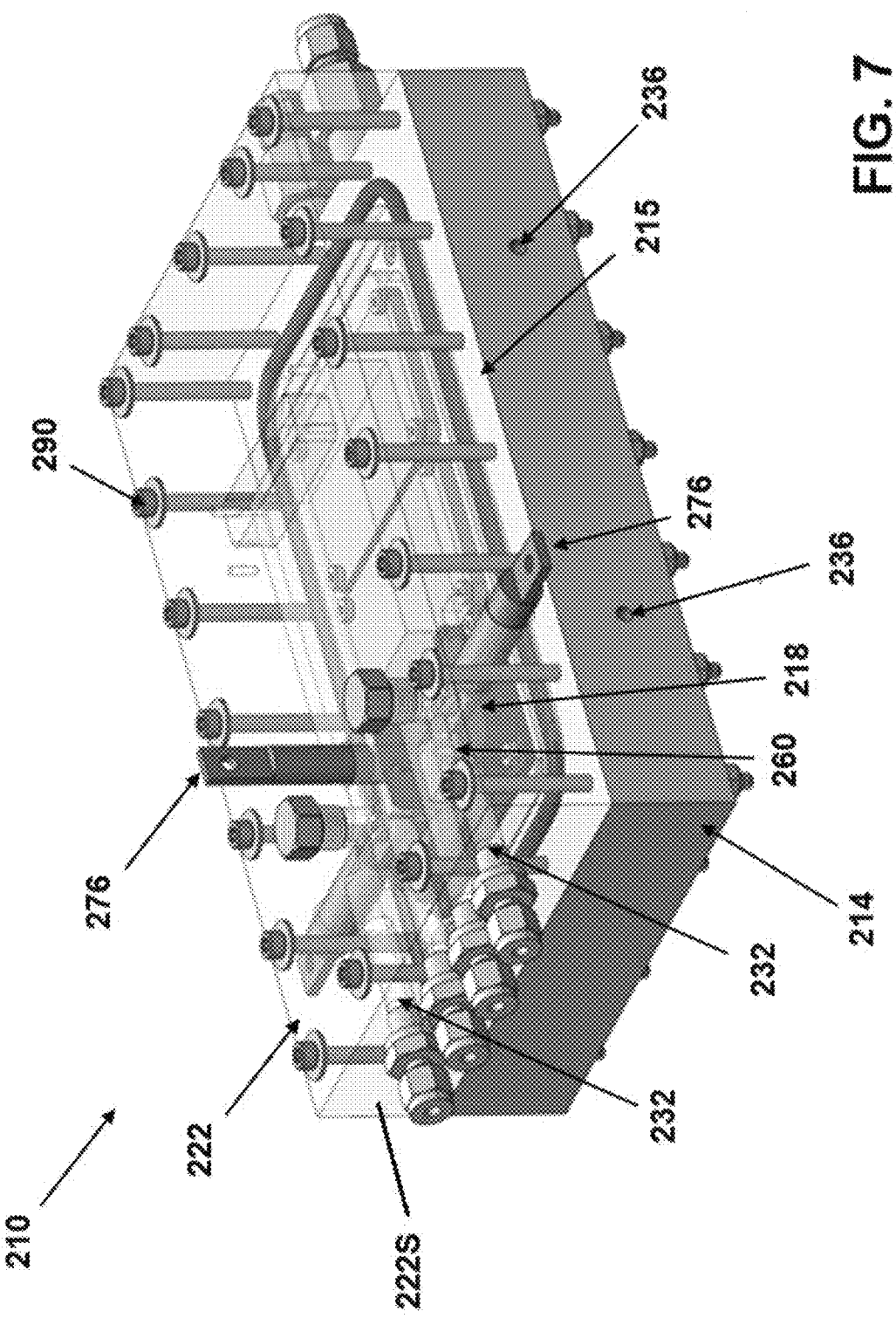
FIG. 7 is a perspective view of the thermal management system according to a further aspect of the present disclosure.

Similar to the thermal management systems 10, 110 described above, the thermal management system 210 directs fluid to the semiconductor die 218 and submerged jet impingement assembly 260, and to the baseplate 214. In this exemplary embodiment, the enclosure 222 occupies the entire top surface 215 of the baseplate 214, as shown in FIG. 7. Moreover, the flow system 230 can include two surface inlet channels 232 that extend inwardly from a side surface 222S of the enclosure 222 and extend over the die 218.

Figure 8:
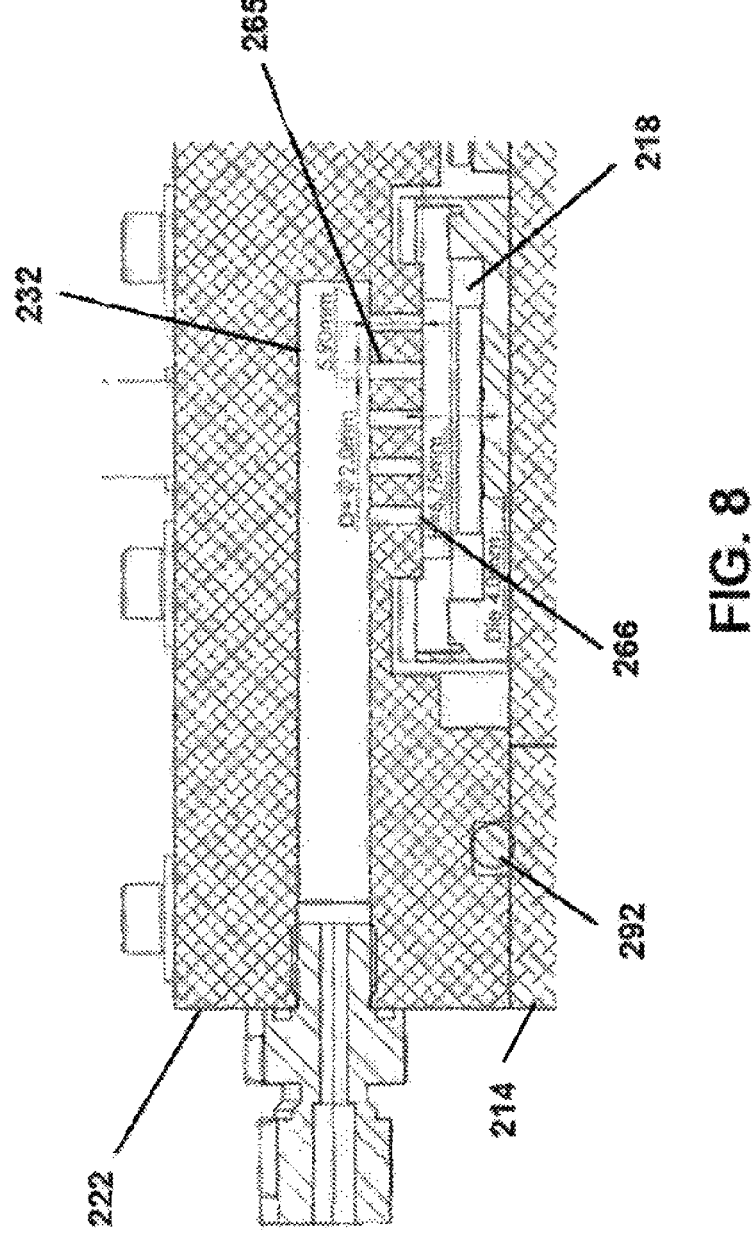
FIG. 8 is a cross-sectional side view of the thermal management system of FIG. 7.
Figures 9A, 9B:
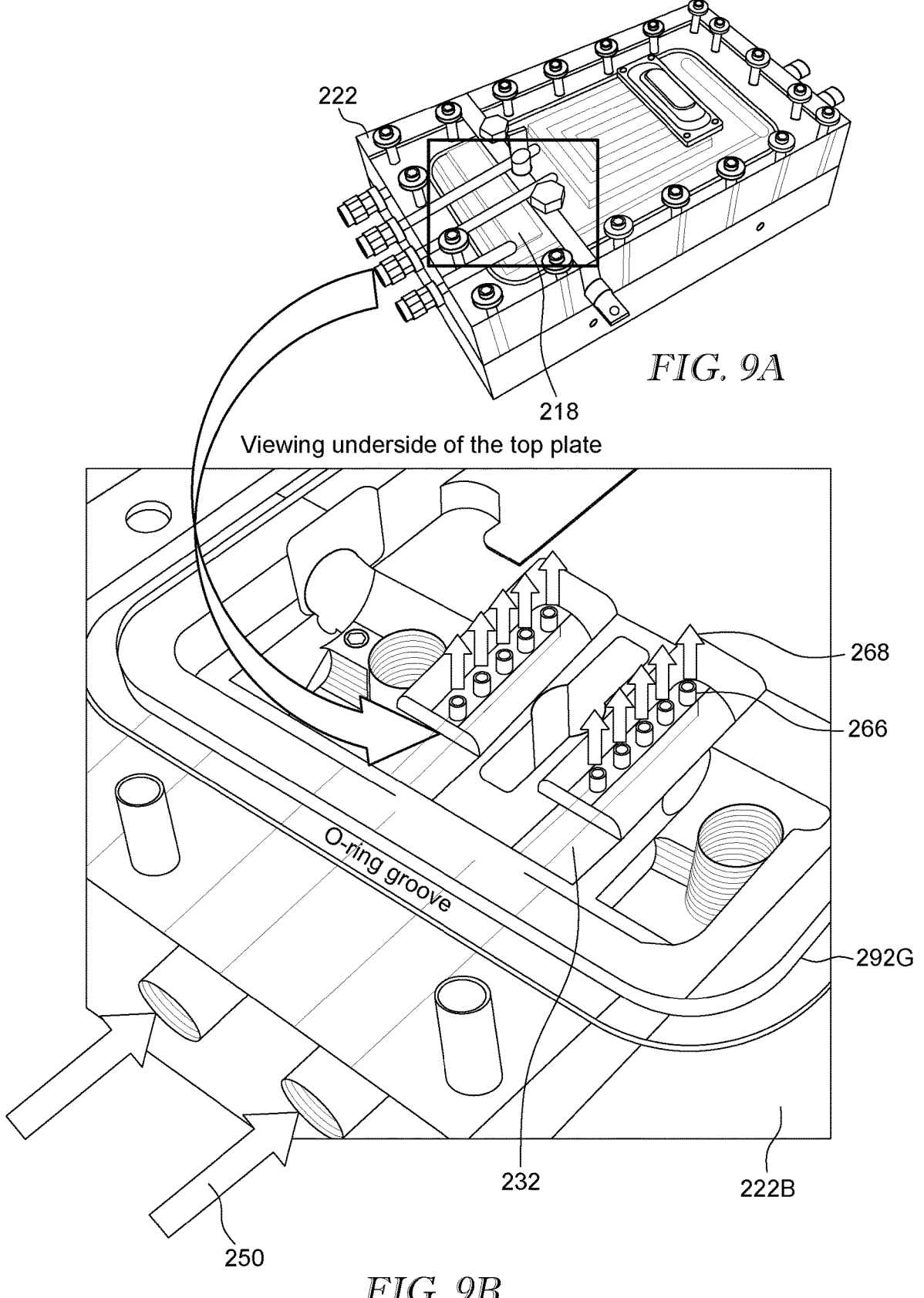
FIG. 9A is an additional perspective view of the thermal management system of FIG. 7.
FIG. 9B is an bottom perspective view of an enclosure of the thermal management system of FIG. 7.

As can be seen in FIG. 8, the surface inlet channels 232 extend inwardly and include multiple delivery nozzles 265 that extend downwardly toward the semiconductor die 18. Each delivery nozzle 265 includes an orifice 266 which ejects the jet 268 (see FIG. 9B) onto the die 18. In some embodiments, as shown in FIGS. 8, 9A, and 9B (showing a bottom side 222B of the enclosure 222), the enclosure 222 may include an O-ring 292 that extends around the bottom surface 222B of the enclosure 222 that rests in a groove 292G formed in the bottom surface 222B. The O-ring 292 may provide additional sealing between the baseplate 214 and the enclosure 222.

A method according to a further aspect of the present disclosure includes providing a baseplate assembly 12 including a baseplate 14 defining an upper baseplate surface 15 and a semiconductor die 18 defining an upper semiconductor surface 21. The method further includes arranging the semiconductor die 18 on the baseplate 14 such that the upper semiconductor surface 21 is spaced apart from the upper baseplate surface 15.

The method further includes providing a flow system 30 including a submerged jet impingement assembly 60 for direct semiconductor die 18 cooling, a first flow path extending over the semiconductor die 18 via the submerged jet impingement assembly 60, and a second flow path in thermal contact with the baseplate 14, the flow system 30 including a fluid 50 flowing through the first flow path and the second flow path. The method further includes directing the fluid 50 to the upper semiconductor surface 21 of the semiconductor die 18 via the first flow path and to the baseplate 14 via the second flow path so as to transfer heat away from the semiconductor die 18 and from the baseplate 14 so as to cool the baseplate assembly 12.

The thermal management system 10, 110 described herein advantageously provides increased overall system 10 power density as a result of the high heat flux rejection capability. The disclosed thermal management system 10, 110 leverages baseplate 14, 114 cooling strategy wherein thermal interface material is eliminated providing a low thermal impedance path between the coolant fluid 50, 152, 154 and the semiconductor junction and associated heat generation source(s). The disclosed thermal management system 10, 110 further combines the low thermal impedance baseplate with direct liquid contact onto the semiconductor die 18, 118 upper surfaces 121 via the submerged jet impingement assembly 60, 160.

The disclosed thermal management system 10, 110 further includes a submerged jet impingement assembly 60, 160 for expanded heat transfer on the semiconductor die 18, 118 upper surface 21, 121 resulting in two key effects. First, a temperature controlled operating region is introduced in lieu of what would traditionally be a heat flux-controlled regime. The consequence is that stable operation of submerged jet impingement is established beyond the nucleate boiling regime, whereas tradition submerged jet-only solutions without a baseplate thermal pathway would be subject to a heat flux-controlled regime resulting in unstable temperature control and semiconductor device failures when exceeding the nucleate boiling regime. Second, expanded heat transfer as a result of extracting heat via the submerged jet impingement convective cooling. Traditionally semiconductor switches are encapsulated in an insulating gel providing only a single path for heat out of the semiconductor die, whereas the thermal management system 10, 110 would enable a secondary pathway for heat transfer out of the device.

The disclosed thermal management system 10, 110 further provides for utilization of dielectric cooling to both protect the power electronic devices and provide enhanced heat transfer capability from a combination of isothermal temperature operation under heating and enhanced convection coefficients in the isothermal region. The disclosed system further provides for utilization of flow arrangement to regulate the degree of sub-cooling deployed to either the baseplate cooling structure or the submerged jet impingement structure.

Figure 10:
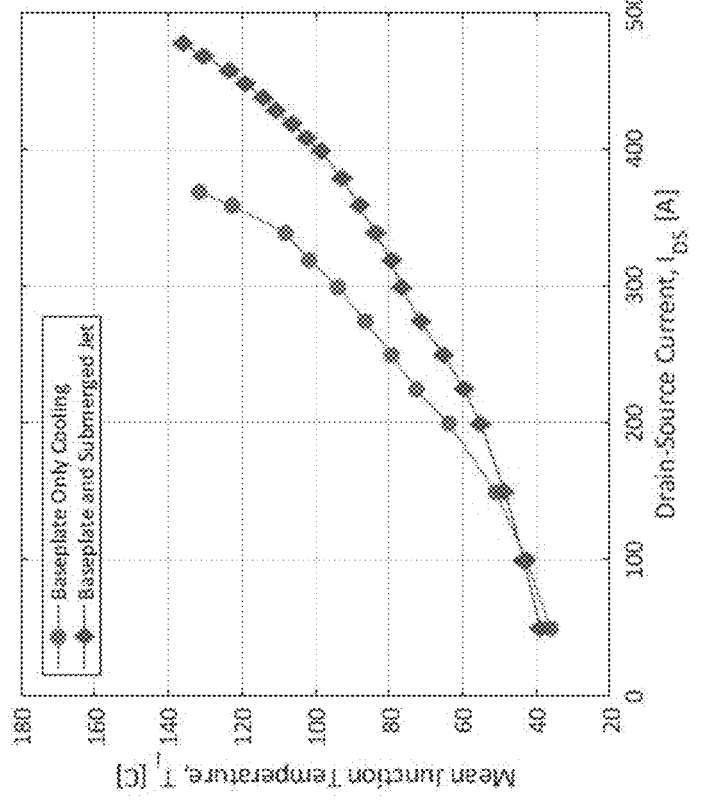
FIG. 10 is a graphical representation of test results for power module semiconductor die junction temperatures versus drain-source current comparing a baseplate only cooling to a combined baseplate plus submerged jet approach.

As shown in FIG. 10, initial hardware studies have demonstrated the potential enhancement enabled by the technology. Utilizing R1233ZD and a commercial off-the-shelf power electronic device modified to support submerged jet impingement on the semiconductor die 18, the current carrying capability of the device was shown to be enhanced beyond that of a baseplate-only cooling solution. The results collected are considered a lower bound for a number of reasons. First, R1233ZD provides suboptimal cooling performance at the tested temperature range due to lower heat transfer coefficients available at the static pressures considered. Second, the jet 68 geometry and jet 68 velocities are well below optimal targets due to spatial limitations present in using an existing device not designed for the cooling approach. Third, no heat transfer surface enhancements (i.e. heat transfer enhancement 80) have been utilized on the semiconductor die surface, further reducing the effectiveness of the approach. Therefore, the performance enhancements noted in FIG. 10 are expected to be extended when using a higher-pressure refrigerant combined with a jet 68 geometry, jet 68 velocity, and power module designed around the cooling technology, combined with heat transfer enhancements 80 applied to the semiconductor die 18.

A person skilled in the art will understand that advancements in electronic systems are pushing shipboard power distribution systems to higher voltage, more power dense solutions. Moreover, it is desirable to reduce cost, increase flexibility, provide rapid scalability, extend life, and lower maintenance. These objectives are in conflict, as increased power density reduces life due to thermal stress on the components. In addition, increased use of renewable energy and the associated transmission and storage, along with growth in the electric vehicle space, suggest development towards higher power density solutions. A limiting factor in power density related to semiconductor power switch devices is the junction temperature of the semiconductor devices. Therefore, in order to expand the operating range of such devices, techniques to lower the junction temperature and improve efficiency at a given operating point would be advantageous. Thermal management solutions that increase heat transfer out of the device serve such purposes and therefore would be advantageous.

It is to be understood that while the invention has been described in this document with respect to a specific but illustrative embodiment, various configurational and size changes may be made within the scope of the invention described and claimed herein. The drawings, although not fully dimensioned, are to scale.

The invention claimed is:

1. A thermal management system, comprising:
a baseplate assembly including a baseplate defining an upper baseplate surface and a semiconductor die defining an upper semiconductor surface, the semiconductor die being arranged on the baseplate such that the upper semiconductor surface is spaced apart from the upper baseplate surface; and
a flow system including a submerged jet impingement assembly for direct semiconductor die cooling, a first flow path extending over the semiconductor die via the submerged jet impingement assembly, and a second flow path through the baseplate with the baseplate, the flow system including a fluid flowing through the first flow path and the second flow path,
wherein the flow system is configured to direct the fluid to the upper semiconductor surface of the semiconductor die via the first flow path and to the baseplate via the second flow path so as to transfer heat away from the semiconductor die and from the baseplate so as to cool the baseplate assembly.

2. The thermal management system of claim 1, wherein the submerged jet impingement assembly includes an inlet manifold that extends transversely above the upper semiconductor surface of the semiconductor die and at least one delivery nozzle fluidically connected to and extending downwardly away from the inlet manifold, and wherein the fluid is directed through the inlet manifold, through the at least one delivery nozzle, and onto the upper semiconductor surface of the semiconductor die to cool the semiconductor die.

3. The thermal management system of claim 2, wherein the baseplate assembly further includes an enclosure arranged on the upper baseplate surface of the baseplate and housing the semiconductor die.

4. The thermal management system of claim 3, wherein the enclosure defines a top surface including at least one opening, wherein the inlet manifold is arranged above the top surface of the enclosure, and wherein the at least one delivery nozzle extends through the at least one opening.

5. The thermal management system of claim 4, wherein the first flow path is defined by at least one surface inlet channel that directs the fluid to the inlet manifold and at least one surface outlet channel that receives the fluid from the enclosure after it has been directed to the upper semiconductor surface via the at least one delivery nozzle and directs the fluid away from the semiconductor die.

6. The thermal management system of claim 5, wherein the second flow path is defined by at least one baseplate inlet channel that directs the fluid into thermal contact with the baseplate, at least one baseplate cooling channel that directs the fluid over or through the baseplate, and at least one baseplate outlet channel that receives the fluid from the at least one baseplates cooling channel and directs the fluid away from the baseplate.

7. The thermal management system of claim 6, wherein the flow system further includes a common surface outlet channel fluidically connected to the at least one surface outlet channel and to the at least one baseplate inlet channel such that the fluid is configured to flow from the at least one surface outlet channel to the at least one baseplate inlet channel so as to define a single continuous flow path from the first flow path to the second flow path.

8. The thermal management system of claim 6, wherein the fluid includes a first fluid and a second fluid, wherein the flow system further includes a surface inlet supply channel configured to supply the first fluid to the first flow path and a baseplate inlet supply channel configured to supply the second fluid to the second flow path, and wherein the first flow path is not in fluidic communication with the second flow path.

9. The thermal management system of claim 8, wherein the first fluid is different than the second fluid.

10. The thermal management system of claim 1, wherein the baseplate is a low thermal impedance baseplate and the fluid is a dielectric refrigerant.

11. The thermal management system of claim 1, wherein the semiconductor die is a field effect transistor die and is directly exposed to the fluid.

12. The thermal management system of claim 1, wherein the fluid is a hydrofluorocarbon refrigerant.

13. A thermal management system, comprising:
a baseplate assembly including a baseplate and a semiconductor die; and
a flow system including a submerged jet impingement assembly for direct semiconductor die cooling and a fluid configured to flow through the flow system and the baseplate,
wherein the flow system is configured to direct the fluid to the semiconductor die via the submerged jet impingement assembly and to the baseplate so as to transfer heat away from the semiconductor die and from the baseplate so as to cool the baseplate assembly.

14. The thermal management system of claim 13, wherein the baseplate is a low thermal impedance baseplate.

15. The thermal management system of claim 13, wherein the fluid is a dielectric refrigerant.

16. The thermal management system of claim 14, wherein the flow system includes a single continuous flow path that extends over the semiconductor die via the submerged jet impingement assembly and that is in thermal contact with the low thermal impedance baseplate.

17. The thermal management system of claim 16, wherein the submerged jet impingement assembly includes an inlet manifold that extends transversely above an upper semiconductor surface of the semiconductor die and at least one delivery nozzle fluidically connected to and extending downwardly away from the inlet manifold, and wherein the fluid is directed through the inlet manifold, through the at least one delivery nozzle, and onto the upper semiconductor surface of the semiconductor die to cool the semiconductor die.

18. The thermal management system of claim 17, wherein the baseplate assembly further includes an enclosure arranged on the upper baseplate surface of the baseplate and housing the semiconductor die.

19. The thermal management system of claim 18, wherein the enclosure defines a top surface including at least one opening, wherein the inlet manifold is arranged above the top surface of the enclosure, and wherein the at least one delivery nozzle extends through the at least one opening.

20. A method, comprising:

providing a baseplate assembly including a baseplate defining an upper baseplate surface and a semiconductor die defining an upper semiconductor surface;

arranging the semiconductor die on the baseplate such that the upper semiconductor surface is spaced apart from the upper baseplate surface;

providing a flow system including a submerged jet impingement assembly for direct semiconductor die cooling, a first flow path extending over the semiconductor die via the submerged jet impingement assembly, and a second flow path through the baseplate with the baseplate, the flow system including a fluid flowing through the first flow path and the second flow path; and directing the fluid to the upper semiconductor surface of the semiconductor die via the first flow path and to the baseplate via the second flow path so as to transfer heat away from the semiconductor die and from the baseplate so as to cool the baseplate assembly.

* * * * *